United States Patent [19]

Tanaka et al.

[11] Patent Number: 4,831,454
[45] Date of Patent: May 16, 1989

[54] IMAGE SENSOR DEVICE HAVING PLURAL PHOTOELECTRIC CONVERTING ELEMENTS

[75] Inventors: Nobuyoshi Tanaka, Tokyo; Toshiji Suzuki, Machida; Tsuneo Suzuki, Hiratsuka; Masaharu Ozaki, Yokohama; Shigetoshi Sugawa; Mahito Shinohara, both of Tokyo, all of Japan

[73] Assignee: Canon Kabushiki Kaisha, Tokyo, Japan

[21] Appl. No.: 22,605

[22] Filed: Mar. 5, 1987

Related U.S. Application Data

[63] Continuation of Ser. No. 813,010, Dec. 24, 1985, abandoned.

[30] Foreign Application Priority Data

Dec. 26, 1984 [JP] Japan .................. 59-273382
Dec. 27, 1984 [JP] Japan .................. 59-273953
Dec. 27, 1984 [JP] Japan .................. 59-273957

[51] Int. Cl.$^4$ ............................... H04N 3/14
[52] U.S. Cl. ................... 358/213.31; 358/213.12; 358/30
[58] Field of Search ............... 358/213, 212; 357/241 R, 30

[56] References Cited

U.S. PATENT DOCUMENTS

| 4,340,909 | 7/1982 | Yamada et al. | 358/213 |
| 4,380,755 | 4/1983 | Endlicher et al. | 358/213 |
| 4,531,156 | 7/1985 | Nishizawa et al. | 358/212 |
| 4,571,624 | 2/1986 | Nishizawa et al. | 358/213 |
| 4,589,003 | 5/1986 | Yamada et al. | 357/30 |
| 4,686,554 | 8/1987 | Ohmi et al. | 358/213.4 |
| 4,731,665 | 3/1988 | Hashimoto et al. | 357/30 |

Primary Examiner—Jin F. Ng
Assistant Examiner—Stephen Brinich
Attorney, Agent, or Firm—Fitzpatrick, Cella, Harper & Scinto

[57] ABSTRACT

An image sensor device provided with a linear array of photoelectric converting elements each having a capacitor on a control electrode area of a semiconductor transistor is disclosed. The image sensor device is provided with means for sequentially selecting the photoelectric converting elements, and the potential of the control electrode area of the selected photoelectric converting element is controlled through said capacitor, thereby accumulating the carriers generated by photoexcitation in said control electrode area and reading a voltage generated according to the amount of carrier accumulation or dissipating thus accumulated carriers.

1 Claim, 15 Drawing Sheets

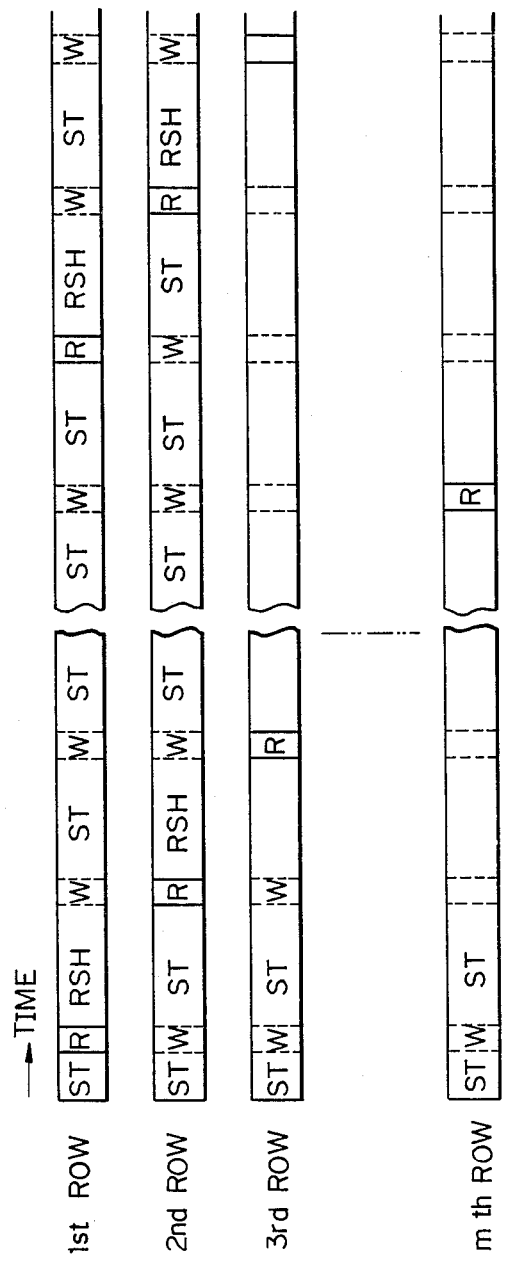

IMAGE SENSOR DEVICE HAVING PLURAL PHOTOELECTRIC CONVERTING ELEMENTS

This application is a continuation of application Ser. No. 813,010 filed Dec. 24, 1985, now abandoned.

BACKGROUND OF THE INVENTION

1. Field of the Invention

The present invention relates to an image sensor device in which are arranged one- or two-dimensionally photoelectric converting elements (hereinafter called photosensor cells) each having a capacitor on the control electrode area of a semiconductor transistor.

2. Description of the Prior Art

Recent developments in image sensor devices have been principally conducted on devices of the CCD type and the MOS type.

The CCD image sensor device is based on the principle that potential wells are formed under MOS capacitor electrodes for accumulating electric charges generated by the entering light, and, in signal reading, said potential wells are moved in succession by pulses supplied to the electrodes, thereby transferring the accumulated charges to an output amplifier. On the other hand, the MOS image sensor device is based on the principle that electric charges generated by the entering light are accumulated in photodiodes constituting a light-receiving area and each comprising a p-n junction, and, in signal reading, MOS switching transistors respectively connected to said photodiodes are turned on in succession to transfer the accumulated charges to an output amplifier.

However, such conventional image sensor devices have been associated with the following drawbacks which will be a major obstacle in achieving higher sensitivity and higher resolving power in the future.

More specifically, the CCD image sensor devices have the drawbacks that (1) the MOS output amplifier, If the formed on the same chip, tends to generate, from the interface between silicon and a silicon oxide layer, 1/f noises which are easily noticeable on the image, (2) the maximum charge that can be accumulated in a potential well is reduced and the dynamic range becomes smaller if the number of cells is increased with a higher density in order to achieve a higher resolving power, and (3) the sequential charge transfer is interrupted if only one cell is defective.

On the other hand, the MOS image sensor devices have drawbacks that (1) a large drop in the signal voltage occurs upon signal reading since a wiring capacitance is connected to each photodiode, (2) a large wiring capacitance tends to generate random noises, and (3) noises of a fixed pattern are present because of fluctuation in the parasitical capacitances of the MOS switching transistors. Thus, for example, in a two-dimensional solid-state image sensor device, image taking under a low illumination becomes difficult, and size reduction of the cells for achieving a higher density deteriorates the S/N ratio, since the wiring capacitance is not significantly reduced while the accumulated charge becomes smaller.

In this manner the CCD and MOS image sensor devices are associated with fundamental problems in achieving a higher resolving power. On the other hand, there has been proposed a new semiconductor image sensor device (European Patent Application Laid-open No. 0132076) in which electric charges generated by the entering light are accumulated in control electrodes, for example bases of bipolar transistors or gates of static induction transistors (SIT) or MOS transistors, and the accumulated charges are amplified at signal reading by the amplifying function of the cells. This structure can provide a high output, a wide dynamic range, a low noise level and a non-destructive signal reading, thus leading to a possibility for a higher resolving power.

However there is a certain limit in the resolving power since this structure, if employed in a two-dimensional image sensor device, is fundamentally based on x-y addressing, and each cell is basically composed of a conventional MOS cell combined with an amplifying element such as a bipolar transistor or a SIT transistor. Also in case a large number of cells are arranged for achieving a high resolving power, a high-speed function is difficult to achieve because shift registers for reading the output signals become complicated. Besides, the S/N ration becomes lower though the output impedance becomes higher.

Also a one-dimensional image sensor device is associated with certain drawbacks which will be explained in the following in relation to the accompanying drawings.

FIG. 1 is a circuit diagram of a conventional one-dementional image sensor device containing an array of plural photosensor cells, in which electric charges are accumulated in capacitors electrically connected to control electrode areas.

Referring to FIG. 1, said photosensor cells 101 are linearly arranged, and output terminals thereof are connected, through MOS transistors $5_1$-$5_n$, to a common output line 20. Said common output line 20 is connected to an output terminal 22 through an output amplifier 21, and is also grounded through a line-refreshing MOS transistor 24. The gates of the MOS transistors $5_1$-$5_n$ are respectively connected to terminals $7_1$-$7_n$ of a logic circuit 19.

In such a conventional image sensor device, the optical information signals of the photosensor cells 101 are serially released through the common output line 20 and the output amplifier 21 by serial activation of the MOS transistors $5_1$-$5_n$.

The time required for signal reading from a photosensor cell 101 is proportional to the floating capacity of the common output line 20. Consequently, the total time required for signal reading rapidly increases with an increase in the number n of the photosensor cells 101.

In this manner, in the conventional structure, the high-speed signal reading operation becomes difficult to achieve, when the number n of the photosensor cells is increased in order to achieve a high resolving power.

Furthermore, in the above-explained photosensor cell 101 in which the electric charge generated by photoexcitation is accumulated in the control electrode, the accumulated charge has to be dissipated for refreshing, after the signal reading is completed. Since such refreshing operation has been conducted at a time for all the photosensor cells 101, so that, particularly in a two-dimensional image sensor device, the time from said refreshing operation to the start of signal reading is different for all photosensor cells 101, and for this reason it has been difficult to achieve a high-speed operation and a uniform photoelectric converting property.

SUMMARY OF THE INVENTION

In consideration of the foregoing, an object of the present invention is to provide a novel image sensor device which is no longer associated with the drawbacks of the conventional image sensor devices.

Another object of the present invention is to provide an image sensor device which can easily provide a high output level, a high sensitivity, a low noise level and a high resolving power.

Still another object of the present invention is to provide an image sensor device capable of high-speed signal reading even when the number of the photosensor cells is increased.

Still another object of the present invention is to provide an image sensor device which is provided with a stable photoelectric converting property and provides a high output level, a resolving power and a high-speed signal reading operation.

Still another object of the present invention is to provide a solid-state image sensor device which allows to easily attain a high cell density and to obtain a wide dynamic range combined with significantly reduced blooming and smear.

BRIEF DESCRIPTION OF THE DRAWINGS

FIG. 2A is a cross-sectional view of a photosensor cell of a line sensor constituting an embodiment of the present invention, while

FIG. 5A is a cross-sectional view of a photosensor cell constituting a second embodiment of the present invention, while

FIG. 10 is a chart showing the function sequence of said fourth embodiment;

FIG. 11A is a plan view of a photosensor cell of the present invention, while

FIG. 13A is a chart showing the relation of the signal readout voltage to the accumulated voltage $V_p$ for a bias voltage $V_{bs}=0.6$ V; while

FIG. 14A is an equivalent circuit diagram of a photosensor cell at the refreshing operation, while

DESCRIPTION OF THE PREFERRED EMBODIMENTS

Now the present invention will be clarified in detail by embodiments thereof shown in the accompanying drawings.

Figure 2A:
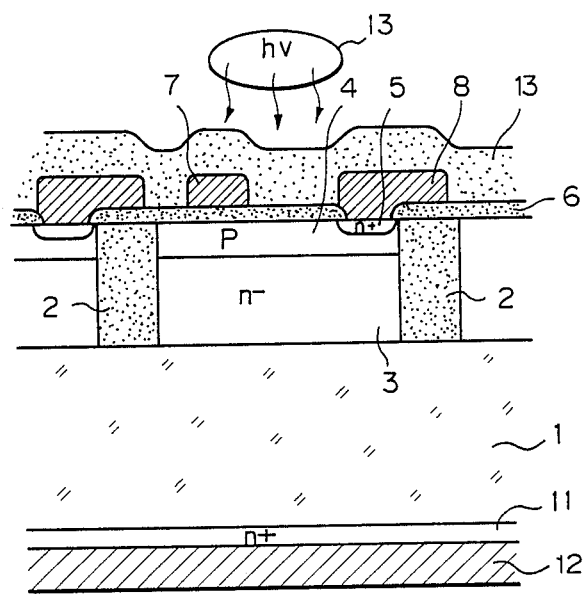
Figure 2B:
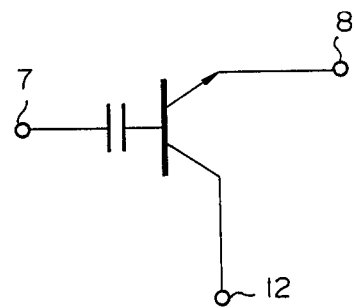
FIG. 2B is an equivalent circuit diagram of said photosensor cell.

FIG. 2A is a cross-sectional view of a photosensor cell in a first embodiment of a line image sensor device of the present invention, and FIG. 2B is an equivalent circuit diagram of said photosensor cell.

Referring to FIG. 2A, on a silicon substrate 1 which is rendered n or n+ type by doping with an impurity such as phosphorus (P), antimony (Sb) or arsenic (As), there are formed an array of photosensor cells each of which is electrically insulated from the neighboring ones by means of separating areas 2 composed of $SiO_2$, $Si_3N_4$ or polysilicon. On the photosensor cells there is formed a passivation layer 13 composed, for example, of a PSG layer.

The structure of each photosensor cell is as follows. On an n⁻-type area 3 of a low impurity concentration formed for example by epitaxy, a p-type area 4 is formed by doping with a p-type impurity, and, in a part of said p-type area 4 there is formed an n+-type area 5 by impurity diffusion or by ion implantation. Said p-type area 4 and n+-type area 5 respectively constitute the base and emitter of a bipolar transistor.

Above said n⁻-type area 3 there is formed an oxide layer 6, on which formed is a capacitor electrode 7 of a determined area. Said capacitor electrode 7 faces said p-type area 4 across an oxide layer 8, whereby the potential of the floating p-type area 4 can be controlled by pulse voltages applied to the capacitor electrode 7. There are further provided an emitter electrode 8 connected to the n+-type area 5; an unrepresented wiring for releasing the signals to the exterior from said emitter electrode 8; an unrepresented wiring connected to the capacitor electrode 7; an n+-type area 11 of a high impurity concentration formed on the rear face of the substrate 1; and an electrode 12 for supplying a potential to the collector of the bipolar transistor.

In the following there will be explained the basic function. Light 14 irradiates the p-type area 4 constituting the base of the bipolar transistor, whereby a charge, composed of holes in this case, corresponding to the quantity of incident light, is accumulated in the p-type area 4 (accumulating operation).

The accumulated holes shift the base potential to positive. Then a positive signal reading voltage $V_r$ is applied to the capacitor electrode 7 to bias the p-type area 4 positively, whereby the p-type area 4 in which the holes are accumulated is biased in the forward direction with respect to the n+-type area 5. Thus a current by electrons flows from the n+-type area 5 to the n⁻-type area 3, so that the n+-type area 5 and the emitter electrode 8 in the floating stat shows an increase in potential. Thus an electric signal corresponding to the amount of incident light can be obtained by reading said change in the potential of the emitter electrode 8 (signal reading operation).

The charge accumulated in the p-type area 4 can be eliminated by grounding the emitter electrode 8 and applying a positive pulse of a positive voltage $V_f$ to the capacitor electrode 7, whereby the p-type area 4 is biased in the forward direction with respect to the n+-type area 5 and the accumulated charge is dissipated (refreshing operation). Thereafter the above-mentioned steps of accumulation, readout and refreshing are repeated.

In short, the above-explained photosensor cell is based on the principle that the electric charge generated by the incident light is accumulated in the p-type area 4 constituting the base, and the current from the emitter 8 to the collector 12 is controlled by the thus accumulated charge. Consequently the charge is read after an amplification due to the amplifying function of each cell. This process provides a high output level, a high sensitivity and a low noise level and is promising for a higher resolving power in the future.

Figure 3:
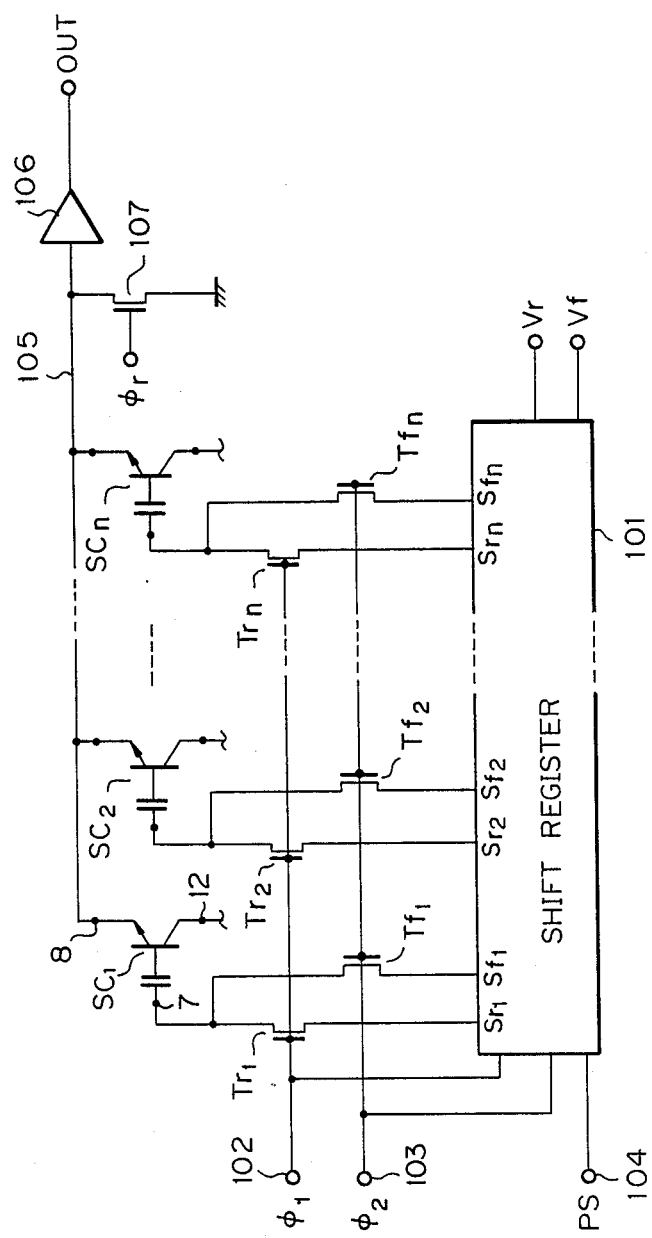
FIG. 3 is a circuit diagram of a first embodiment of a line sensor of the present invention.

FIG. 3 is a circuit diagram of a line image sensor constituting a first embodiment of the present invention. In FIG. 3, photosensor cells SC1–SCn of the structure shown in FIG. 1A have mutually connected collector electrodes 12. Capacitor electrodes 7 are connected, respectively through switching transistors Tr1–Trn, to output terminals Sr1–Srn for signal readout of a shift register 101, and further connected, respectively through switching transistors Tf1–Tfn, to output termianls Sf1–Sfn for refreshing of said shift register 101.

The gates of the switching transistors Tr1–Trn are commonly connected a terminal 102, while those of the switching transistors Tf1–Tfn are commonly connected to a terminal 103. Said terminals 102 and 103 respectively receive two-phase clocks $\phi 1$ and $\phi 2$ to turn on and off said switching transistors in synchronization with said clock signals.

The shift register 101 is connected with terminals 102, 103 and 104 to receive the abovementioned clock signals $\phi 1$ and $\phi 2$ and to receive a start pulse PS from the terminal 104. In synchronization with the two-phase clock pulses $\phi 1$ and $\phi 2$, the output terminals Sr1–Srn of the shift register 101 in succession release signal reading pulses of a voltage Vr while the output terminals Sf1–Sfn release refreshing pulses of a voltage Vf as will be explained later.

The emitter electrodes 8 of the photosensor cells SC1–SCn are commonly connected to a signal readout line 105, which is connected to an input terminal of an output amplifier 106 and is grounded through a switching transistor 107. Said switching transistor 107 is provided to dissipate the charge on the signal readout line, and receives, through the gate thereof, a clock signal $\phi r$ determining the timing of charge dissipation.

Figure 4:
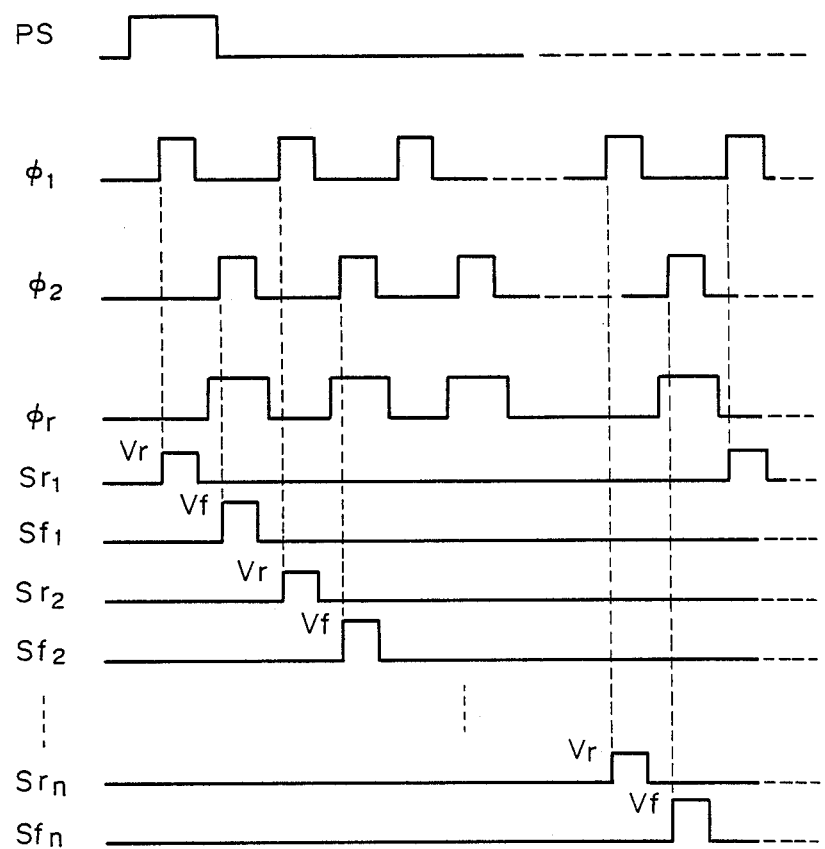
FIG. 4 is a timing chart showing the function of said first embodiment.

In the following there will be given an explanation on the function of the above-explained embodiment, while making reference to a timing chart shown in FIG. 4.

It is assumed that charges corresponding to the incident light are already stored in the base areas 4 of the photosensor cells SC1–SCn through the accumulating step explained above.

At first a start pulse PS is supplied to the shift register 101, and a clock signal $\phi 1$ is supplied to said shift register 101 and to the gate of the switching transistor Tr1. The clock $\phi 1$ turns on the switching transistor Tr1, and, in synchronization with said clock $\phi 1$ a signal readout pulse of a voltage Vr is released from the terminal Sr1 of the shift register 101. Said signal readout pulse is transmitted through the switching transistor Tr1 in the on-state and is supplied to the capacitor electrode 7 of the photosensor cell SC1. In response there is conducted a signal readout operation as explained before whereby the emitter 8 of the photosensor cell SC1 releases a signal representing optical information, which is supplied through the line 105 to the output terminal after amplification in the output amplifier 106.

Upon completion of signal readout from the photosensor cell SC1, the switching transistor 107 is turned on by the clock $\phi r$ to ground the signal readout line 105, thus dissipating the charge accumulated in the wiring capacity. Simultaneously, in response to the clock $\phi 2$, the terminal Sf1 of the shift register 101 releases a refreshing pulse of a voltage Vf, which is transmitted through the switching transistor Tf1 turned on by said clock $\phi 2$ and supplied to the capacitor electrode 7. In this manner the charges accumulated in the photosensor cell SC1 and in the signal readout line 105 are eliminated.

Subsequently, in response to a clock $\phi 1$, the terminal Sr2 supplies a pulse of the voltage Vr to the capacitor electrode of the photosensor cell SC2, thus effecting the signal readout therefrom. Upon completion of said signal readout, the photosensor cell SC2 is refreshed by a clock $\phi 2$, while the signal readout line 105 is refreshed by a clock $\phi r$.

In this manner the optical information of all the photosensor cells SC1–SCn can be serially read by effecting the signal readout and refreshing for each photosensor cell in synchronization with the clocks $\phi 1$ and $\phi 2$. Since each photosensor cell is refreshed at the completion of the signal readout operation, the photosensor cells can collectively enter the accumulating operation when the signal readout and refreshing for the last cell SCn are completed. Thereafter the above-explained steps are repeated.

Figure 5A:
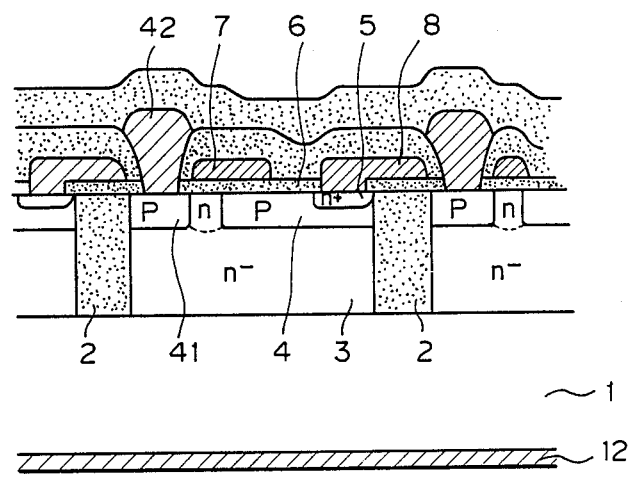
Figure 5B:
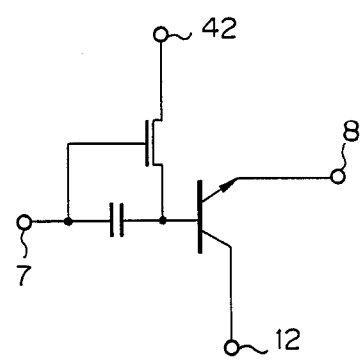
FIG. 5B is an equivalent circuit diagram of said photosensor cell.

FIG. 5A is a cross-sectional view of a photosensor cell constituting a second embodiment of the present invention, and FIG. 5B is an equivalent circuit diagram of said photosensor cell.

In the present embodiment, at the elimination of the accumulated holes, the p-type area 4 is set at a determined potential by a MOS transistor to achieve complete refreshing. As shown in FIG. 5A, the refreshing MOS transistor is composed of main electrode areas consisting of a p-type area 4 and a p-type area 41 formed on an n$^-$-type epitaxial layer 3, and the capacitor electrode 7 positioned across an oxide layer 6 serves as the gate.

Thus, in the present embodiment, the MOS transistor is turned off when a positive voltage is supplied to the capacitor electrode 7 but is turned on to connect the electrode 42 with the p-type area 4 when a negative voltage exceeding a determined threshold value is supplied.

Figure 6:
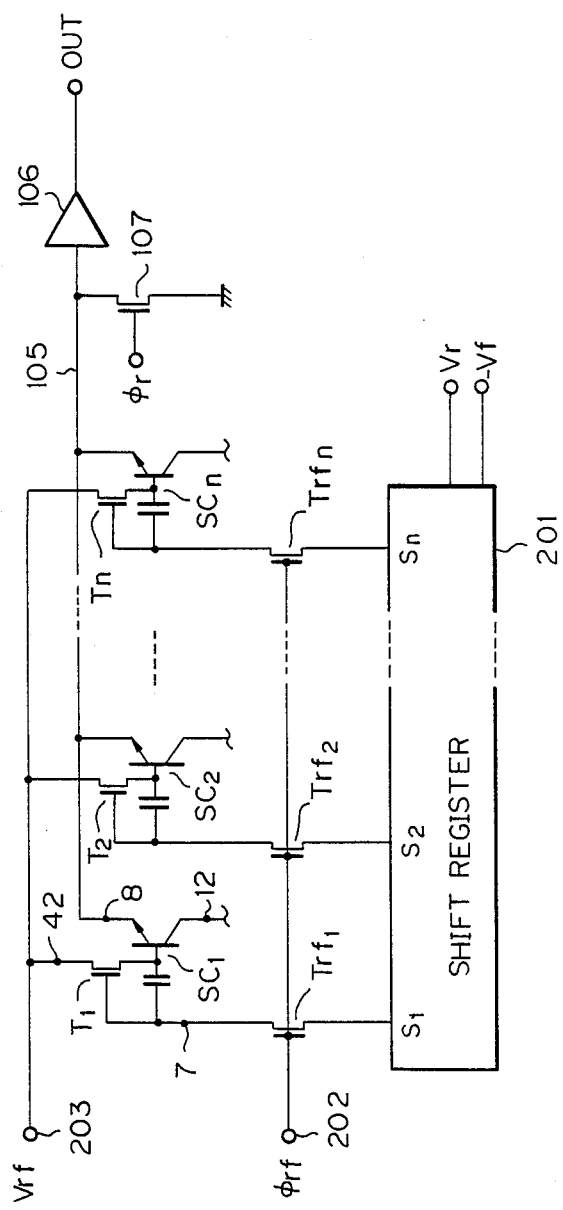
FIG. 6 is a circuit diagram of the second embodiment of the present invention.

FIG. 6 is a circuit diagram of an image sensor device constituting the second embodiment of the present invention. In FIG. 6, photosensor cells SC1–SCn are respectively provided with refreshing MOS transistors T1–Tn. The capacitor electrodes 7 of the photosensor cells are connected, respectively through switching transistors Trf1–Trfn, to output terminals S1–Sn of a shift register 201, and the gates of said transistors Trf1–Trfn are commonly connected to a terminal 202 for effecting on-off operations by clocks $\phi_{rf}$.

In synchronization with said clocks $\phi_{rf}$, the shift register 201 releases a signal readout pulse of a positive voltage Vr and a succeeding refreshing pulse of a negative voltage −Vf, in succession, from the terminals S1–Sn.

Electrodes 42 of the photosensor cells SC1–SCn are commonly connected to a terminal 203, receiving a determined refreshing voltage Vrf. Other components same as those in the first embodiments are represented by same numbers and will not be explained further.

Figure 7:
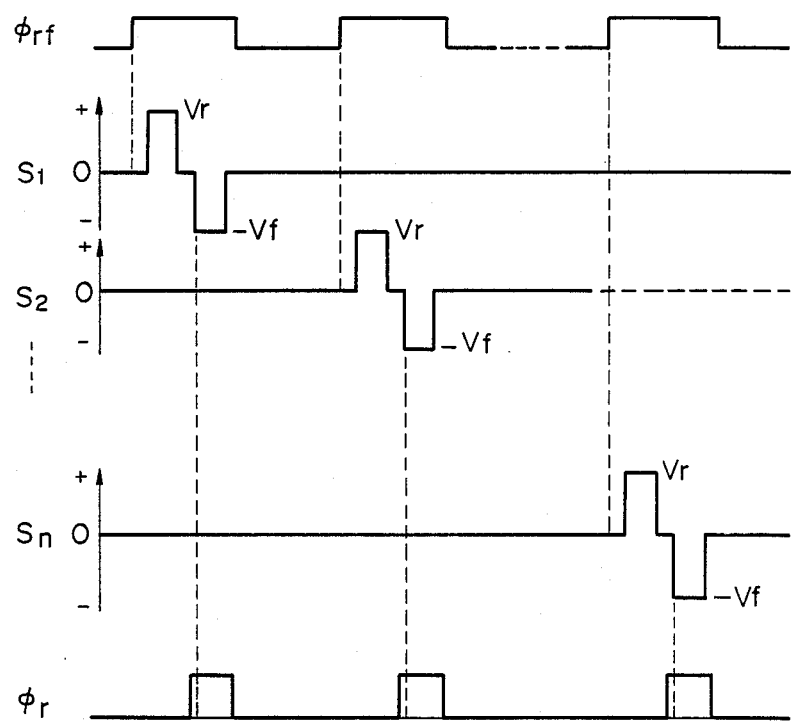
FIG. 7 is a timing chart showing the function of said second embodiment.

In the following there will be given an explanation on the function of the above-explained second embodiment, while making reference to a timing chart shown in FIG. 7.

When the switching transistor Trf1 is turned on by a clock $\phi$rf, the terminal S1 of the shift register 201 releases a signal readout pulse of a positive voltage Vr, which is supplied, through said switching transistor Trf1, to the capacitor electrode 7 of the photosensor cell SC1. Because of said positive voltage Vr the MOS transistor T1 remains turned off, and the photosensor cell SC1 effects a signal readout operation explained above.

Subsequently the terminal S1 supplies a refreshing pulse of a negative voltage $-Vf$ to the capacitor electrode 7 of said photosensor cell SC1 to turn on the MOS transistor T1, whereby the base area 4 releases the charge accumulated therein through the electrode 42 and is set at a determined potential Vrf. Simultaneously with said refreshing operation, the switching transistor 107 is turned on to refresh the signal readout line 105.

The above-explained operations are effected in succession in the photosensor cells SC1-SCn and the optical information is serially released from the output terminal.

The present embodiment allows to arbitrarily select the potential of the base area 4 and to achieve complete refreshing by suitably selecting the refreshing voltage Vrf.

Though the MOS transistors T1-Tn are formed in the photosensor cells, they may also be formed on the separating areas 2. It is also possible to form said separating area 2 with a semiconductor of the same conductive type as the base area 4 to achieve insulation by a p-n junction and to form a refreshing MOS transistor by maintaining said separating area at a potential Vrf.

In the following there will be explained a third embodiment of the present invention, employing the photosensor cells of a structure shown in FIG. 1A.

Figure 8:
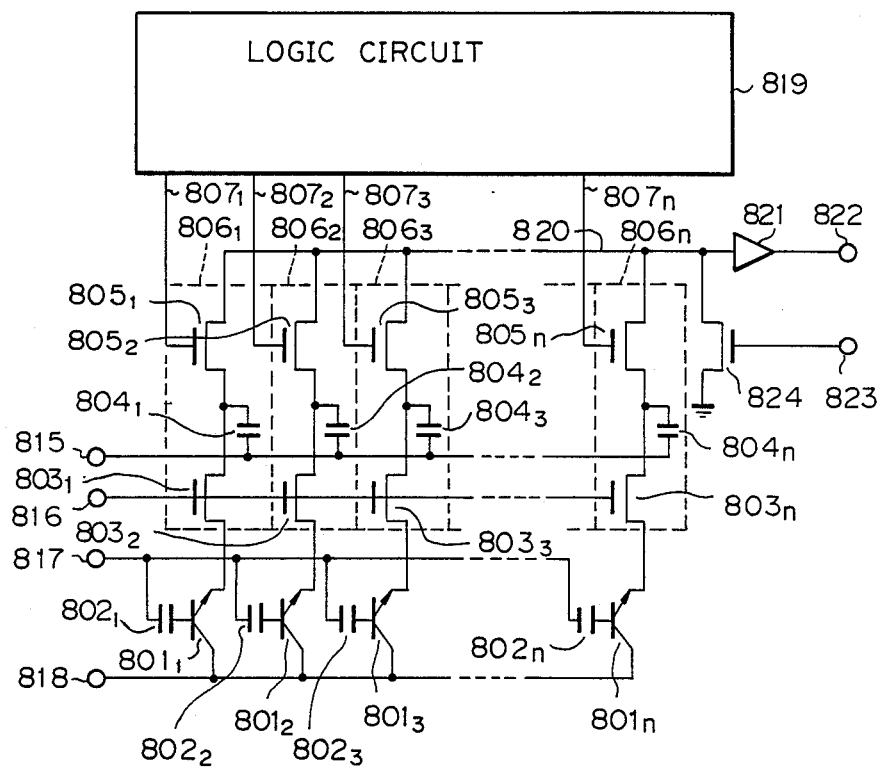
FIG. 8 is a circuit diagram of a third embodiment of the image sensor device of the present invention.

In FIG. 8, there are shown phototransistors $801_1$-$801_n$; capacitors $802_1$-$802_n$ for respectively transmitting control signals to said phototransistors; sample-hold circuits $806_1$-$806_n$ composed of MOS transistors $803_1$-$803_n$ for on-off controlling the output signals from the emitters of the phototransistors $801_1$-$801_n$, capacitors $804_1$-$804_n$ for accumulating said output signals, and MOS transistors $805_1$-$805_n$ for controlling the readout of the output signals from said capacitors; a logic circuit 819 for controlling the on/off state of the MOS transistors $805_1$-$805_n$; an amplifier 821 for output signal reading; a common output line; a MOS transistor 824 for dissipating the charge accumulated in the common output line 820; a positive voltage input terminal 818; a power supply input terminal 815; an output terminal 822; a control input terminal 823 for supplying a control signal to the MOS transistor 824; a control signal input terminal 816 for supplying control signals to the MOS transistors $803_1$-$803_n$; a control signal input terminal 817 for supplying control signals to the capacitors $802_1$-$802_n$; and output terminals $807_1$-$807_n$ of the logic circuit.

In the following explained is the function of the third embodiment of the present invention. It is assumed that the MOS transistors $803_1$-$803_n$, $805_1$-$805_n$ and 824 are of n-channel type.

In the accumulation step, the MOS transistors $803_1$-$803_n$ are turned on by an H-level signal supplied to the control signal input terminal 816, while the MOS transistors $805_1$-$805_n$ are turned on by H-level signals released from all the output terminals $807_1$-$807_n$ of the logic circuit 819, and the MOS transistor 824 is turned on by an H-level signal entered from the input terminal 823, whereby all the emitters of the phototransistors $801_1$-$801_n$ are grounded. Also a positive bias voltage is entered from the positive voltage input terminal 818 to positively bias all the collectors of the phototransistors $801_1$-$801_n$.

On the other hand, all the bases of said phototransistors $801_1$-$801_n$ are biased at a negative potential $-aV_{RF}$ by a refreshing operation to be explained later. In this state the photosensor cells are irradiated with light to accumulate holes in the bases thereof. The voltage accumulated in the base is represented as $\Delta V_B$.

In the signal readout operation, the MOS transistors $803_1$-$803_n$ are turned on by an H-level signal supplied to the control signal input terminal 816 while the MOS transistors $805_1$-$805_n$ are turned off by L-level signals released from all the output terminals $807_1$-$807_n$ of the logic circuit 819, whereby the emitters of the phototransistors $801_1$-$801_n$ are connected with the capacitors $804_1$-$804_n$. Also all the collectors of the phototransistors $801_1$-$801_n$ are positively biased by a positive bias voltage supplied to the input terminal 818. In this state a pulse of a positive voltage $V_{RE}$ is entered through the input terminal 817, whereby, in a photosensor cell irradiated by light, the base potential of the phototransistor becomes equal to $a(V_{RE}-V_{RF})+\Delta V_B$ to obtain a collector current determined by the base current. Thus the output voltage of the phototransistor, representing the optical information, is held in the connected capacitor. On the other hand, in the photosensor cell not irradiated with light, the base voltage of the phototransistor is equal to $a(V_{RE}-V_{RF})$, which is equal to zero if $V_{RE}=V_{RF}$, so that no charge is accumulated in the corresponding capacitor.

For reading the voltages held in the capacitors $804_1$-$804_n$ through the output terminal 832, the MOS transistors $803_1$-$803_n$ are turned off by entering an L-level signal from the input terminal 816 and H-level signals are released in succession from the output terminals $807_1$-$807_n$ of the logic circuit thereby turning on the MOS transistors $805_1$-$805_n$ in succession. At each readout of the accumulated voltage from the output terminal 822 through the amplifier 821, an H-level signal is entered through the input terminal 823 to turn on the MOS transistor 824, thereby discharging the capacitor after signal readout, and then the input terminal 823 is shifted again to the L-level to turn of the MOS transistor 824. In this manner the signal readout of a line can be achieved by effecting the signal readout operation from the sample hold circuits $806_1$-$806_n$ to the output terminal 822 in succession.

The time required for signal readout of a line is represented by $t_{RE1}+n(t_{RE2}+t_{RE3})$, wherein $t_{RE1}$ represents time required for signal readout from a phototransistor $801_i$ to the sample hold circuit $806_i$, $t_{RE2}$ is a time required for reading the voltage accumulated in the sample hold circuit $806_i$ through the output terminal 822, and $t_{RE3}$ is a time required for discharging the capacitor $804_i$ of the sample hold circuit $806_i$. Said readout time $t_{RE2}$ from the capacitor $804_i$ to the output terminal 822 and said discharge time $t_{RE3}$ are small because the MOS transistors $805_1$-$805_n$ constituting the sample hold circuit $806_1$-$806_n$ can be composed of high-speed switching MOS transistors. On the other hand, the phototransistors $801_1$-$801_n$ have a certain amplifying function, but the emitter current is limited, if the photosensor cells are arranged at a high density, since the amount of carriers generated in the base area decreases due to a smaller size of the cell. Consequently the signal readout time $t_{RE1}$ from the phototransistors is relatively large, compared to $t_{RE2}$ and $t_{RE3}$.

The readout time $t_{RE1}$ from the phototransistors depends on the capacities of the capacitors $804_1$–$804_n$, which in turn are determined by the floating capacity of the common output line 820.

In the following the signal readout time of a line of the present embodiment, when the capacities of the capacitors $804_1$–$804_n$ are selected equal to the floating capacity of the common output line 820, is compared with the signal readout time of a line in the conventional structure shown in FIG. 1.

Figure 1:
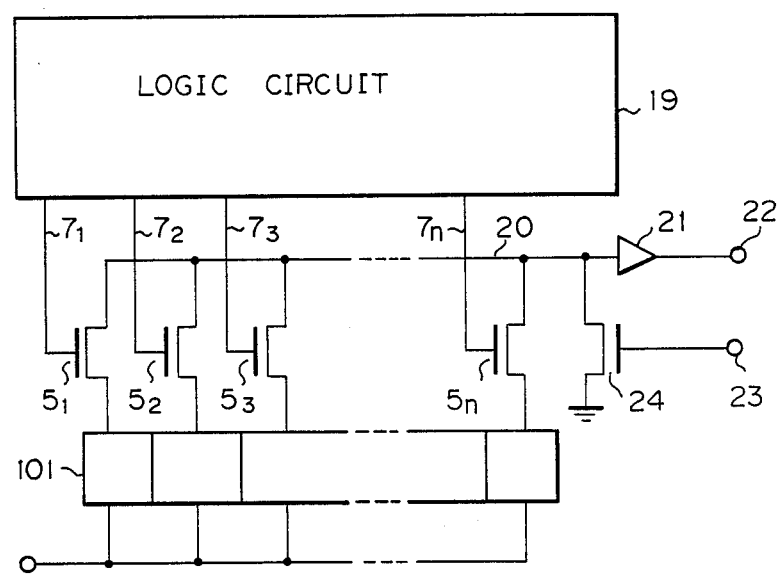
FIG. 1 is a circuit diagram of a conventional image sensor device.

In the conventional structure shown in FIG. 1, the signal readout time for a line is represented by $n(t_{RE1} + t_{RE3})$ since the signal readout time from a photosensor cell 101 to the output terminal 22 is equal to the aforementioned time $t_{RE1}$ for signal accumulating time in the capacitor $804_i$, and the discharge time from the common output line 20 is likewise equal to $t_{RE3}$. Similar to the aforementioned third embodiment, $t_{RE1} >> t_{RE3}$. For example, in a line sensor with a large value of n, the comparison of signal readout times leads to a conclusion $n(t_{RE1} + t_{RE3}) >> t_{RE1} + n(t_{RE2} + t_{RE3})$, indicating that the image sensor device of the third embodiment is capable of signal readout with a sufficiently high speed.

Then, in the refreshing step, the MOS transistors $803_1$–$803_n$ are turned by an H-level signal supplied to the input terminal 816, while the MOS transistors $805_1$–$805_n$ are also turned by H-level signals released from all the output terminals $807_1$–$807_n$ of the logic circuit 819, and the MOS transistor 824 is also turned on by an H-level signal entered from the input terminal 823, whereby all the emitters of the phototransistors $801_1$–$801_n$ are grounded. In addition a positive bias voltage is entered from the positive voltage input terminal 818 to positively bias all the collectors of the phototransistors $801_1$–$801_n$. The refreshing operation is conducted by entering, in this state, a pulse of a positive voltage $V_{RF}$ through the control signal input terminal 817, whereby the base potential returns to the initial negative potential $-aV_{RF}$.

The function of the image line sensor is effected by repeating the above-explained steps of accumulation, readout and refreshing.

In the present third embodiment, the MOS transistors $803_1$–$803_n$, $805_1$–$805_n$ and 824 are assumed to be of n-channel type, it is also possible to employ p-channel transistors or complementary transistors in which p-channel and n-channel transistors are combined.

In the following there will be explained a fourth embodiment of the present invention.

Figure 9:
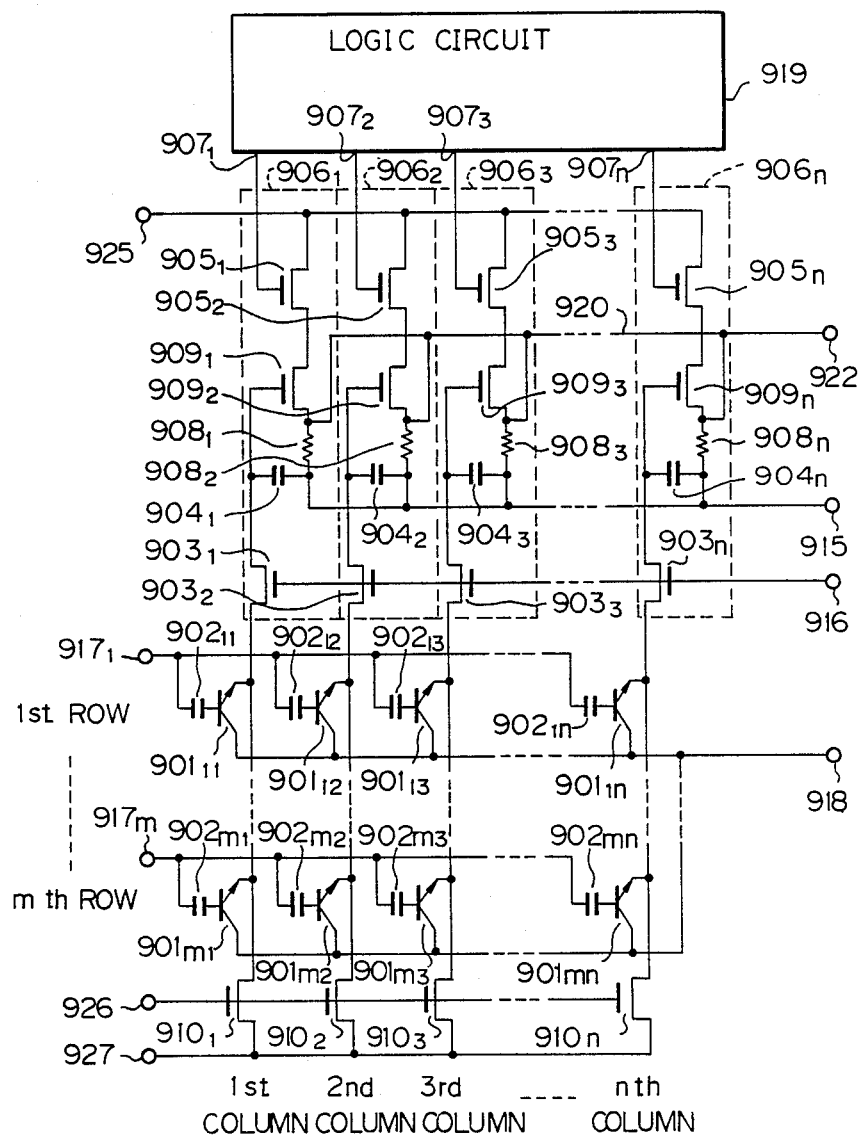
FIG. 9 is a circuit diagram of a fourth embodiment of the image sensor device of the present invention.

FIG. 9 is a circuit diagram of the fourth embodiment of the present invention, in which shown are phototransistors $901_{11}$–$901_{mn}$ and capacitors $901_{11}$–$901_{mn}$ for transmitting control signals to said phototransistors, both two-dimensionally arranged in n columns and m rows; and sample hold circuits $906_1$–$906_n$ composed of MOS transistors $903_1$–$903_n$ for controlling the output signals from the emitters of the phototransistors $901_{11}$–$901_{mn}$, capacitors $904$ $904_n$ connecting main electrodes of said MOS transistors $903_1$–$903_n$ with a power input terminal 915, MOS transistors $909_1$–$909_n$ of which gates are connected to the main electrodes of said MOS transistors $903_1$–$903_n$, MOS transistors $905_1$–$905_n$ of which main electrodes are respectively connected to the MOS transistors $901_1$–$009_n$ and to the power input terminal 925 and of which gates are respectively connected to the terminals $907_1$–$907_n$ of a logic circuit 919, and resistors $908_1$–$908_n$ connected at ends thereof to the other main electrodes of the MOS transistors $909_1$–$909_n$ and to a common output line 920 and connected at the other ends to the power input terminal 915. There are further provided a control signal input terminal 917 for supplying control signals to the photosensor cells; a control signal input terminal 916 for supplying control signals to the MOS transistors $903_1$ $903_n$; a positive voltage input terminal 918; an output terminal 922; a control input terminal 926 for supplying control signals to the MOS transistors $910_1$–$910_n$; and a power input terminal 927.

In the following there will be explained the function of the fourth embodiment shown in FIG. 9.

As already explained before, the phototransistors $901_{11}$–$901_{mn}$ of the present invention achieve photoelectric conversion by a basic function consisting of an accumulation step, a signal readout step and a refreshing step. In FIG. 9 it is assumed that all the MOS transistors are of n-channel type, that the positive voltage input terminal 918 and the power input terminal 925 receive positive voltages, and that the input terminals 915 and 927 are grounded.

In the accumulation step, an H-level signal is supplied to the control input terminal 926 to turn on the MOS transistors $910_1$–$910_n$, thereby grounding all the emitters of the phototransistors $901_{11}$–$901_{mn}$. Also a positive voltage is supplied to the input terminal 918 to positively bias all the collectors of said phototransistors, and a pulse of a positive voltage $V_{RF}$ is supplied from arbitrary one of the control signal input terminals $917_1$–$917_n$ to bias the bases of the phototransistors $901_{11}$–$901_{mn}$ at a determined negative potential. In this state the photosensor cells are irradiated with light to accumulate holes in the base areas.

The pulse for negatively biasing the bases of the phototransistors $901_{11}$–$901_{mn}$ may be given to a row or plural rows at a time.

In the signal readout, an H-level signal is supplied to the control signal input terminal 916 to turn on the MOS transistors $903_1$–$903_n$ and an L-level signal is supplied to the control signal input terminal 927 to turn off the MOS transistors $910_1$–$910_n$, whereby all the emitters of the phototransistors $901_{11}$–$901_{mn}$ are left open, and a positive bias voltage is supplied through the positive voltage input terminal 918 to positively bias all the collectors of the phototransistors $901_{11}$–$901_{mn}$. In this state pulses of a positive voltage $V_{RE}$ are supplied in an arbitrary or sequential order to the control signal input terminals $917_1$–$917_m$.

When the pulse of voltage $V_{RE}$ is supplied to an input terminal $917_i$, the outputs of the phototransistors $901_{i1}$–$901_{i1}$ are held in the capacitors $904_1$–$904_n$ of the sample hold circuits $906_1$–$906_n$ and the accumulated voltages in said capacitors $904_1$–$904_n$ are applied to the gates of the MOS transistors $909_1$–$909_n$.

The signal readout from the sample hold circuits $906_1$–$906_n$ to the output terminal 922 is effected by supplying an L-level signal through the control input terminal 916 to turn off the MOS transistors $903_1$–$903_n$ and releasing H-level signals in succession from the output terminals $907_1$–$907_n$ of the logic circuit 919, thereby turning on the MOS transistors $905_1$–$905_n$ in succession.

Thus, in response to an H-level signal from the output terminal $907_1$ of the logic circuit 919, the MOS transistor $905_1$ is turned on to apply the positive voltage at the terminal 925 to the MOS transistor $909_1$. Consequently a current corresponding to the voltage applied to the gate is generated between the main electrodes of the MOS transistor $909_1$, thus generating a voltage, across the resistor $908_1$, corresponding to the accumulated voltage in the capacitor 904, and said voltage is released from the output terminal 922 as an optical information signal. Thereafter the voltages accumulated in the capacitors $904_1-904_n$ are released in succession through the output terminal 922.

After the signal readout of an i-th row, the phototransistors $901_{i1}-901_{in}$ and the capacitors $904_1-904_n$ are refreshed by entering an H-level signal to the control input terminal 916 to turn on the MOS transistors $903_1-903_n$ and entering an H-level signal through the control input terminal 926 to turn on the MOS transistors $910_1-910_n$, whereby the capacitors $904_1-904_n$ are discharged through the MOS transistors $903_1-903_n$ and $910_1-910_n$. Similarly the phototransistors $901_{i1}-901_{in}$ are refreshed by applying a positive voltage to the input terminal $917 917_i$.

Upon completion of the refreshing operation explained above, the phototransistors $901_{i1}-901_{in}$ initiate the accumulating operation. Simultaneously the signal readout and refreshing are effected in the above-explained manner for the phototransistors $901_{j1}-901_{jn}$ of a j-th row.

Since the optical information signals of each row are collectively held in the capacitors $904_1-904_n$ and then are serially released, it is possible to simultaneously effect the signal readout and refreshing of a row and the accumulation for other plural rows.

The signal readout and refreshing need not necessarily be effected for each row but may be effected for plural rows at a time.

The above-explained circuit of FIG. 9, constituting the fourth embodiment of the present invention, is characterized by a fact that the refreshing and accumulation for different rows and the signal readout from the sample hold circuits can be simultaneously conducted. Consequently the photoelectric conversion can be achieved in a sequence in which the time from the refreshing to the signal readout is maintained constant in any row.

FIG. 10 is a chart showing the operating sequence, for further clarifying the function of said fourth embodiment.

In FIG. 10, R indicates the signal readout operation from the phototransistors to the sample hold circuits $906_1-906_n$; RSH indicates a period of signal readout from the sample hold circuits $906_1-906_n$ to the output terminal 922 and refreshing of the phototransistors; ST indicates the accumulating period; and W indicates that the signal readout is conducted on certain phototransistors outside the row of said symbol W. More specifically, in the period W, the base of the phototransistor is maintained negative to effect the accumulating operation, but the emitter is shifted to a positive potential because the signal readout is conducted from the emitter of phototransistors of another row to the sample hold circuits. However the potentials of the emitter and base are still maintained in an inverse bias state, as in the accumulation. In FIG. 10 it is particularly noteworthy that the distance between two neighboring R's is constant in any row, and this fact is particularly meaningful when the number m of rows is increased, or when the number of photosensor cells is increased. There is required a long time for the signal readout from the 1st row to the last m-th row if the number M of row is large. Thus, if the accumulation and readout are effected after simultaneous refreshing for all rows, the last row will have a longer accumulation time and will therefore show a different photoelectric converting characteristic in comparison with the first row. Such drawback does not appear in the circuit of FIG. 9 and sequence of FIG. 10 as the period from refreshing to signal readout is constant in any row. Though the MOS transistors in the fourth embodiment shown in FIG. 9 are composed of N-channel MOS transistors, it is also possible to employ P-channel MOS transistors or complementary circuits in which N- and P-channel MOS transistors are combined. Also the cathode-follower amplifiers employed in the sample-hold circuits may be replaced by other amplifiers such as differential amplifiers.

In the following there will be explained still other embodiments of the present invention.

Figure 11A:
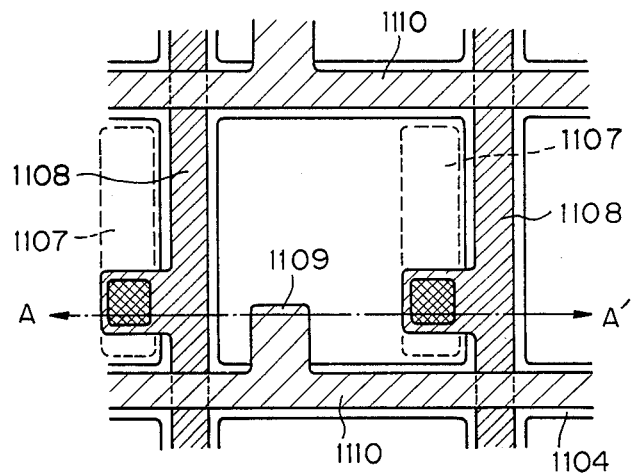
Figure 11B:
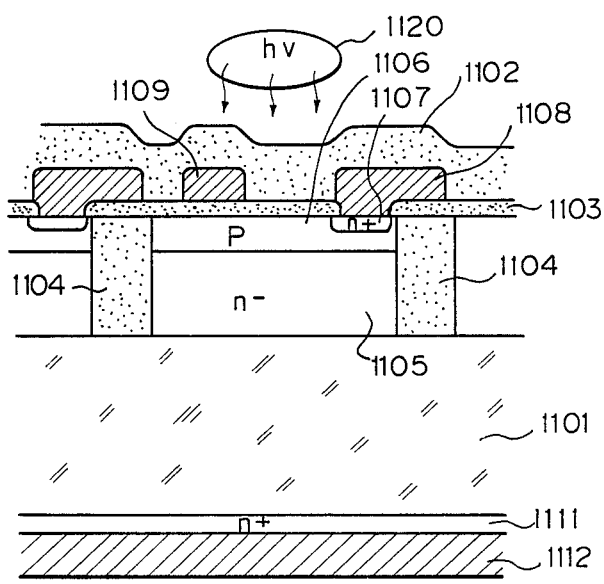
FIG. 11B is a cross-sectional view thereof along a line A-A'.
Figure 12:
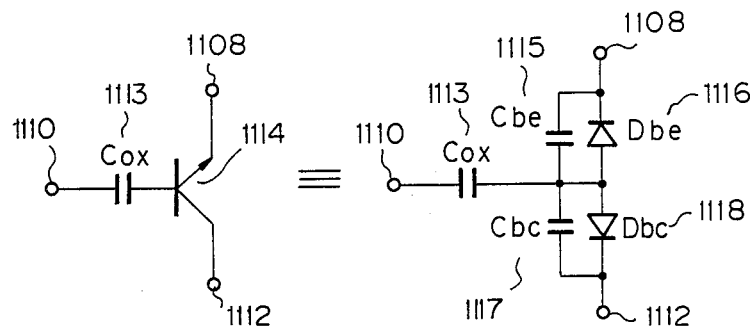
FIG. 12 is an equivalent circuit diagram of said photosensor cell.

FIGS. 11 and 12 illustrate the basic structure and function of a photosensor cell to be employed in the ensuing embodiments.

FIG. 11A is a plan view of said photosensor cell, FIG. 11B is a cross-sectional view thereof along a line A-A', and FIG. 12 is an equivalent circuit thereof, wherein same components are always represented by same numbers.

In FIG. 11 there is shown an arrangement in rows and columns, but there may naturally be employed a staggered arrangement of pixels in order to improve the resolving power in the horizontal direction.

Said photosensor cell is provided with a structure as explained in the following. As shown in FIGS. 11A and 11B, there are provided, on an n-type silicon substrate 1102;

a passivation layer 1102;

an insulating oxide layer 1103 composed of silicon oxide;

a separating area 1104 composed of an insulating layer or a polysilicon layer for electrically separating the neighboring photosensor cells;

an $n^-$-type area 1105 of a low impurity concentration formed for example by epitaxy;

a p-type area 1106 formed thereon to constitute a base of a bipolar transistor;

an $n^+$-type area 1107 constituting an emitter of said bipolar transistor;

a wiring 1108 composed of a conductive material such as aluminum for signal readout to the exterior;

a capacitor electrode 1109 opposed to the p-type area 1106 across the insulator 1103 for applying pulses to said p-type area 1106 in the floating state;

a wiring 1110 connected to said capacitor electrode 1109;

an $n^+$-type area 1111 formed on the bottom face of the substrate 1101 for making ohmic contact; and an electrode 1112 for supplying a collector potential to said bipolar transistor.

In the equivalent circuit shown in FIG. 12, a capacitor $C_{ox}$ 1113 is composed, in a MOS structure, of the electrode 1109, insulating layer 1103 and p-type area 1106, while a bipolar transistor 1114 is composed of the $n^+$-type area 1107 functioning as the emitter, p-type area 1106 functioning as the base and $n^-$-type area 1105 and area 1101 functioning as the collector. Also as will be understood from these drawings, the p-type area 1106 is maintained in the float-state.

In the equivalent circuit, the bipolar transistor 1114 is represented by a junction capacity Cbe 1115 of the base and emitter; a p-n junction diode Dbe 1116 between the base and emitter; a junction capacity Cbc 1117 between the base and collector; and a p-n junction diode Dbc 1118 between the base and collector.

In the following the above-explained photosensor cell will be clarified in further detail, in particular relation to other embodiments to be explained later.

The basic function of said photosensor cell is composed, as already explained before, of a charge accumulation step in response to the incident light, a signal readout step and a refreshing step. In the charge accumulation, the emitter is grounded through the wiring 1108, while the collector is positively biased through the wiring 1112. The base is in advance biased inversely to the emitter 1107.

In such state, as shown in FIG. 11, in response to the entry of light 1120 from the tope face of the photosensor cell, a pair of electron and hole is generated in the semiconductor. The electrons flow toward the n-type area 1101 because of the positive bias thereof, but the holes are accumulated in the p-type area 1106, whereby the potential thereof gradually changes toward positive side. The potential Vp caused by the accumulation of photo-generated holes in the base is given by $Vp=Q/C$, wherein Q is the amount of accumulated charge, while C is a summed junction capacity of Cbe 1115 and Cbc 1117.

It is to be noted that the potential Vp generated by the incident light remains almost constant even when the photosensor cell size is reduced to achieve a higher resolving power, since the amount of accumulated charge Q decreases with the decrease in the amount of light per cell while the junction capacity decreases proportional to the cell size. This is due to a fact that the photosensor cell of the present invention can have a very large effective light-receiving area, because of the very simple structure as shown in FIG. 11.

In the following there will be explained an operation of reading a voltage generated by the charge accumulated in the p-type area 1106.

In the signal readout step, the emitter and the wiring 1108 are maintained in the floating state, while the collector is maintained at a positive potential Vcc.

In this state the base potential is equal to $-Vb+Vp$, wherein $-Vb$ is a negative bias potential of the base 1106 prior to light irradiation, and Vp is the accumulated voltage generated by said irradiation. Then a positive voltage Vr for signal reading is applied to the electrode 1109 through the wiring 1110. Said voltage is divided by the oxide layer capacity $C_{ox}$ 1113, base-emitter junction capacity Cbe 1115 and base-collector junction capacity Cbc 1117, so that the base potential is shifted to:

$$-Vb + Vp + \frac{Cox}{Cox + Cbe + Cbc} Vr$$

With a following additional forward bias Vbs:

$$Vbs = -Vb + \frac{Cox}{Cox + Cbe + Cbc} Vr$$

the base potential is further biased in the forward direction, in comparison with the voltage Vp accumulated by the light irradiation. Consequently the electrons are injected from the emitter to the base, and reach the collector through acceleration by the drift electric field, because of the positive collector potential.

Figure 13A:
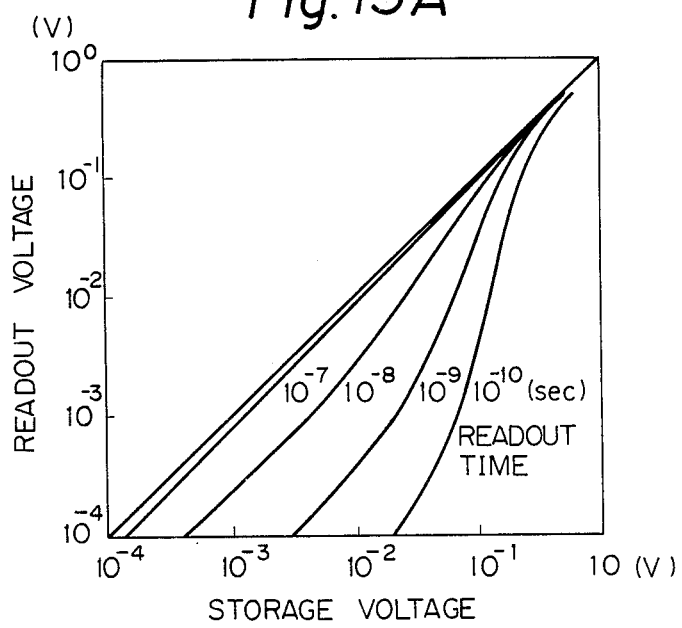

FIG. 13A is a chart showing the relation between the accumulated voltage Vp in case of Vbs=0.6 V and the signal readout voltage.

It will be understood, from said chart, that the accumulated voltage Vp and the signal readout voltage are linearly proportional over a range in excess of 10,000 times, so that a high-speed signal readout is ensured if the readout time, in which the readout voltage Vr is applied to the capacitor electrode 1109, is selected longer than ca. 100 nsec. In the foregoing example, the wiring 1108 has a capacity of 4 pF while the junction capacity Cbe+Cbc is equal to 0.01 pF, with a ratio of ca. 300 times. However the accumulated voltage Vp generated in the p-type area 1106 is not influenced, and an extremely speedy signal readout is rendered possible by the effect of the bias voltage Vbs. This is due to an effective contribution of the amplifying function of the photosensor cells. In comparison with such high output voltage, the fixed pattern noises and random noises resulting from the output capacity are relatively small, so that an extremely high S/N ratio can be obtained.

Figure 13B:
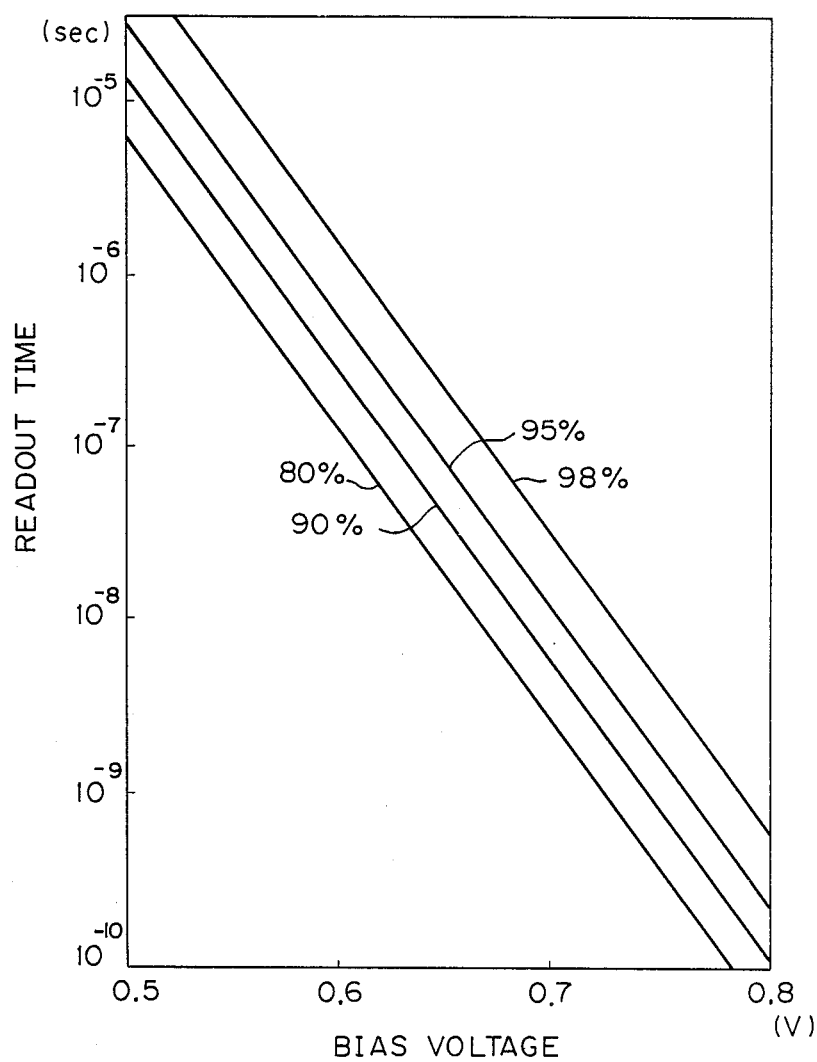
FIG. 13B is a chart showing the relation of the signal reading time to said bias voltage $V_{bs}$.

It was already explained that a linearity over a range of ca. 10,000 times could be obtained with a high-speed signal readout time of ca. 100 nsec when the bias voltage Vbs is selected equal to 0.6 V. FIG. 13B shows this linearity and the relationship between the signal readout time and the bias voltage Vbs.

FIG. 13B allows to know the signal readout time required by the readout voltage to reach a desired percentage of the accumulated voltage, at a given bias voltage Bvs. Consequently the chart shown in FIG. 13B allows to determine the required bias voltage Vbs, once the signal readout time and the linearity required for the overall design of the image sensor device are determined.

Another advantage of the photosensor cell of the present invention is the possibility of nondestructive readout because the probability of recombination of electron and hole in the p-type area 1106 is quite low. This fact indicates the possibility of a new function in case said photosensor cells are constructed as an image sensor device.

The p-type area 1106 can maintain the voltage Vp for an extremely long time, and the maximum holding time is rather limited by a dark current thermally generated in the depletion layer of the junction. However, in said photosensor cell, the depletion layer is present in the $n^-$-type area 1105 with a very low impurity concentration with a high crystallinity, so that few pairs of electrons and holes are thermally generated.

In the following there will be explained a process of dissipating the charge accumulated in the p-type area 1106.

In the above-explained photosensor cell, the charge accumulated in the p-type area 1106 is not dissipated in the signal readout operation as already explained before. For this reason, in order to enter new optical information, the previously accumulated charge has to be dissipated in a refreshing operation. It is at the same time necessary to maintain the p-type area 1106 in the floating state at a determined negative potential.

Figure 14A:
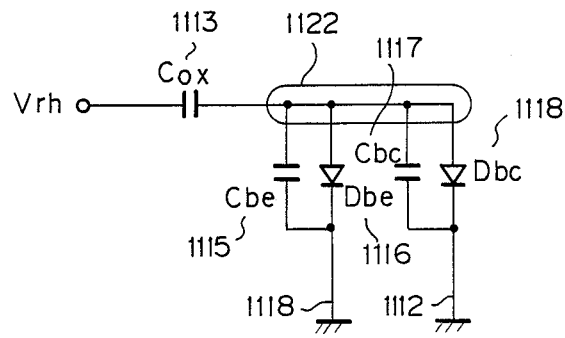

In said photosensor cell, the refreshing operation is effected, just like the signal readout, by applying a positive voltage to the electrode 1109 through the wiring 1110. At the same time the emitter is grounded through the wiring 1108. The collector is grounded or maintained at a positive potential through the electrode 1112. FIG. 14A shows an equivalent circuit for refreshing operation, wherein the collector is grounded.

If a positive voltage Vrh is applied to the electrode 1109 in this state, a voltage:

$$\frac{Cox}{Cox + Cbe + Cbc} Vrh$$

obtained by capacitative division through the oxide layer capacity Cox 1113, base-emitter junction capacity Cbe 1115 and base-collector junction capacity Cbc 1117, is instantaneously applied to the vase 112 as in the signal readout step. Said voltage forms a forward bias in the base-emitter junction diode Dbe 1116 and the base-collector junction diode Dbc 1118, thus generating currents therein, whereby the base potential is gradually lowered.

Figure 14B:
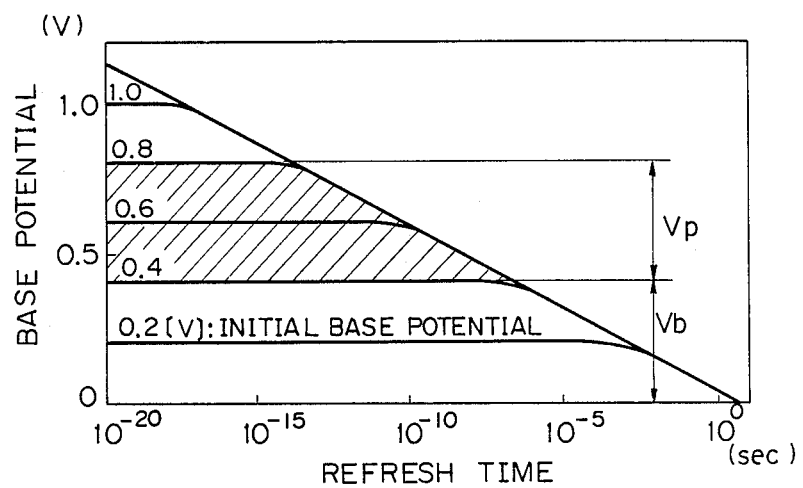
FIG. 14B is a chart showing the change of base potential in relation to the refreshing time.

FIG. 14B shows the result of calculation of change in the potential of floating base, as an example of time dependence of the base potential, wherein the abscissa indicates the refreshing time or the time after the application of the refreshing voltage Vrh to the electrode 1109, while the ordinate indicates the base potential, indicating various initial base potentials. The initial base potential is the potential of the floating base when the refreshing voltage Vrh is applied, and is determined by Vrh, Cox, Cbe, Cbe and the charge accumulated in the base.

FIG. 14B indicates that the base potential is not determined by the initial potential but shows a linear change in logarithmic scale after the lapse of a determined time.

The p-type area 1106 can be biased to a negative potential in two ways, by applying a positive voltage through the MOS capacitor Cox for a determined period and then removing said voltage. In one method, a negative charge is accumulated by the flow of positively charged holes from the p-type area 1106 to the n-type area 1101 in grounded state.

On the other hand, it is also possible to accumulate a negative charge in the p-type area 1106 by a flow of electrons from the n+-type area 1107 and the n-type area 1101 to cause recombination with the holes.

The solid-state solid image sensor device employing the above-explained photosensor cells has a complete refreshing mode, in which the base potential of all the photosensor cells is brought to zero (requiring 10 seconds in the example shown in FIG. 14B), and a transient refreshing mode, in which a variable component resulting from the accumulated voltage Vp is dissipated though a certain base potential remains (requiring 10 μsec to 10 sec in the example shown in FIG. 14B.

The complete refreshing mode or the transient refreshing mode is selected according to the purpose of use of the image sensor device.

In the foregoing there has been given an explanation on the basic function of the above-explained photosensor cell consisting of the charge accumulation in response to the incident light, signal readout and refreshing, and the observation of incident light or the readout of optical information is rendered possible through a basic cycle consisting of the above-mentioned steps.

As explained in the foregoing, the photosensor cell explained above is much simpler in structure in comparison with that disclosed in the aforementioned European Patent Application Laid-open No. 0130276, thus providing an ample possibility for a higher resolving power in the future, and retains the advantages of a low noise level, a high output level, a wide dynamic range and a non-destructive signal readout resulting from the amplifying function.

In the following there will be explained solid-state image sensor devices employing the above-explained photosensor cells.

Figure 15:
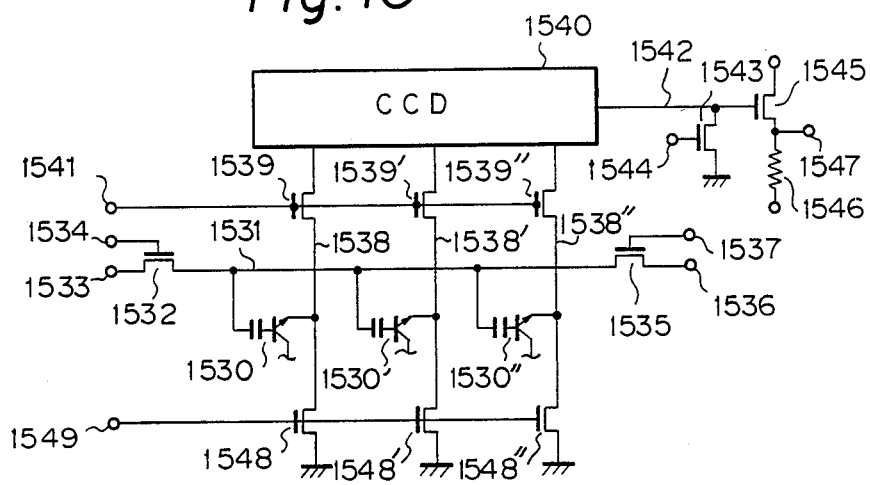
FIG. 15 is a circuit diagram of a solid-state image sensor device composed of a linear array of the above-mentioned photosensor cells and constituting a fifth embodiment of the present invention.

FIG. 15 is a circuit diagram of an embodiment of a solid-state image sensor device, composed of a sensor cells.

In FIG. 15, there are provided three photosensor cells 1530 of which collectors 1512 are commonly connected. Capacitor electrodes 1510 of said photosensor cells 1530 are connected to a horizontal line 1531 for supplying readout pulses and refreshing pulses. Said horizontal line 1531 is connected, through a buffer MOS transistor 1532, to a terminal 1533 for supplying refreshing pulses, and the gate of said buffer MOS transistor 1532 is connected to a terminal 1534. Also the horizontal line 1531 is connected, through a buffer MOS transistor 1535, to a terminal 1536 for supplying readout pulses, and the gate of said transistor is connected to a terminal 1537.

Emitters 1508 of the photosensor cells 1530 are respectively connected to vertical lines 1538, 1538', 1538" for signal readout for each column, and said vertical lines are connected, respectively through gate MOS transistors 1539, 1539', 1539", to the input terminal of a P-type CCD register 1540. The gates of said gate MOS transistors 1539, 1539', 1539" are connected to a terminal 1541 for generating pulses for controlling the vertical lines.

The output terminal of the CCD register 1540 is connected to an output signal line 1542, which is grounded through a refreshing transistor 1543, whose gate is connected to a terminal 1544. Said output signal line 1542 is further connected to the gate of a signal amplifying transistor 1545, of which drain is connected to a load resistor 1546 and an output terminal 1547 for releasing the amplified output signals.

The vertical lines 1538, 1538', 1538" are grounded through refreshing MOS transistors 1548, 1548', 1548", of which gates are commonly connected to a terminal 1549.

Figure 16:
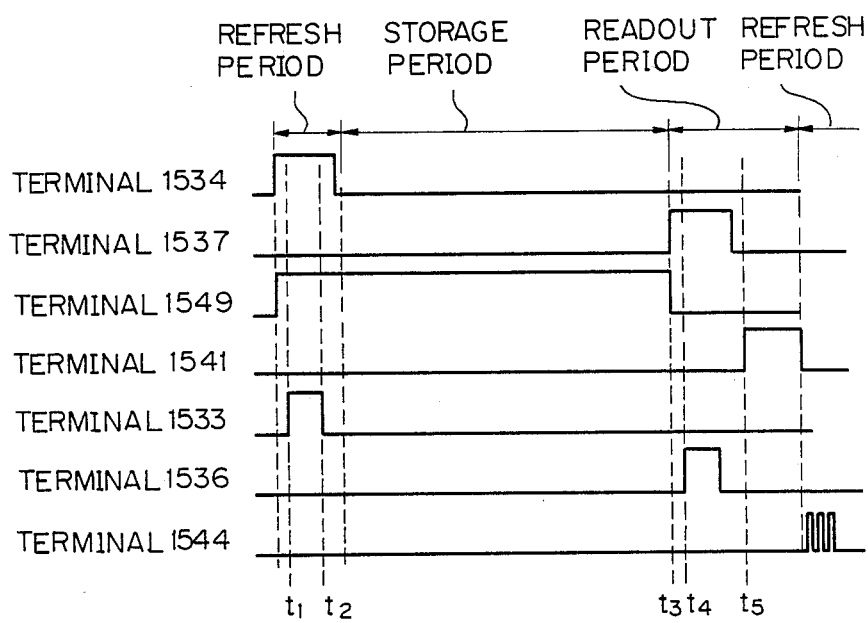
FIG. 16 is a timing chart showing the function of said embodiment.

In the following there will be given an explanation on the function of the above-explained solid-state image sensor devive, while making reference to a timing chart shown in FIG. 16.

At a time t1, the terminal 1549 is maintained at an H-level to turn on the MOS transistors 1548, 1548', 1548" whereby the photosensor cells are grounded through the vertical lines 1538, 1538', 1538". An H-level signal is also supplied to the terminal 1534 to turn on the refreshing MOS transistor 1532. In this state, a refreshing pulse supplied to the terminal 1533 is transmitted through the horizontal line 1531 to provide the bases of the photosensor cells with a voltage Vrh, whereby the refreshing operation is initiated to dissipate the accumulated charges according to the complete refreshing mode or the transient refreshing mode.

At a time t2, the bases of the transistors of the photosensor cells are inversely biased with respect to the emitters, thus initiating a succeeding accumulation. In the refreshing period, all other pulses are maintained at an L-level state as will be understood from the drawing.

In the accumulation period, the electrons of the electron-hole pairs generated by light irradiation can be rapidly dissipated into the collector since the substrate, or the collector of transistor, is maintained at a positive potential.

In the accumulation step, the terminal 1549 is maintained at an H-level state as in the refreshing step to maintain the MOS transistors 1548, 1548', 1548" in the conductive state, whereby the emitters of the photosensor cells are grounded through the vertical lines 1538, 1538', 1538". If the base is saturated with holes under a strong light irradiation, or, if the base becomes biased in forward direction with respect to the grounded emitter potential, the holes flow through the vertical lines 1538, 1538', 1538", so that the base potential no longer moves and is clipped in this state. Consequently the blooming phenomenon can be avoided by the grounding of the vertical lines, even though the emitters of vertically neighboring photosensor cells are commonly connected to the vertical lines 1538, 1538', 1538".

Succeeding to the accumulation period, the signal readout period starts from a time t3, when the terminal 1549 is shifted to an L-level state, and terminal 1537 is shifted to an H-level state, thereby turning off the MOS transistors 1548, 1548', 1548" and turning on the MOS transistor 1535.

At a time t4, a readout pulse of a voltage Vr is supplied to the terminal 1536, whereby the signal readout from three photosensor cells connected to the horizontal line 1531 is effected through the MOS transistor 1535.

Then, at a time t5, an H-level signal is supplied to the terminal 1541 to turn on the MOS transistors 1539, 1539', 1539", whereby the output signals of the photosensor cells are simultaneously supplied to the CCD registor 1440. Said output signals stored in the CCD register 1540 are transferred in succession, after the completion of the signal readout period, to the output signal line 1542, then amplified by the transistor 1545 and released through the output terminal 1547. After the transfer of each output signal, a charge remains in the output signal lines 1542, due to a wiring capacity. For dissipating said retentive charge, an H-level signal is supplied to the terminal 1544 in synchronization with the transfer timing of the CCD register 1540, so that the output signals are transferred, in separated state, to the transistor 1545.

In the foregoing explanation, there is assumed an application in which the accumulation period and the signal readout period can be clearly separated, for example in a still video system which has been actively developed in recent years. However the present invention is also applicable, with a suitable modification in the timing of pulses shown in FIG. 16, to the fields in which the function during the accumulation period and that during the signal readout period proceed simultaneously, for example in a television camera or a facsimile apparatus.

In the present embodiment, the final amplifier can be made simpler in comparison with the MOS image sensor device since a high output voltage can be obtained by the amplifying function of each photosensor cell.

The MOS transistor employed as the signal amplifier 1545 in the present embodiment can be naturally replaced by other amplifying means such as a bipolar transistor.

Though the present embodiment employs a p-type CCD register as the CCD register 1540, an n-type CCD register may also be employed if the output charge from each photosensor cell is subtracted from a charge accumulated in advance in the register.

As detailedly explained in the foregoing, the image sensor device of the present invention provides a higher output voltage, a higher sensitivity and a lower noise level, thus enabling to achieve a higher resolving power, in comparison with conventional MOS or CCD image sensor devices.

Besides, the image sensor device of the present invention is capable of a high-speed signal readout operation even for an increased number of photosensor cells, thus providing a high-speed operation combined with a high resolving power, since the signals from plural photosensor cells are temporarily retained in holding means and then released sequentially.

Also in a two-dimensional array, the photosensor cells can have a uniform accumulation time, thus ensuring a stable photoelectric converting characteristic, because each photosensor cell can be refreshed immediately after the signal readout operation. Also a high-speed operation is rendered possible because of the absence of idle time after the completion of signal readout as in the conventional structure.

Furthermore, the image sensor device of the present invention can achieve a higher packing density because a pixel is complsed of single transistor, and still shows significantly reduced blooming and smear phenomena. It also provides a higher sensitivity and a wider dynamic range.

Also, the amplifying function of the photosensor cells themselves allows to obtain a high signal voltage without relying on the wiring capacity, to achieve a low noise level and facilitates the designing of peripheral circuits Also, the transfer of the output signals from the photosensor cells with a CCD register allows to achieve a higher packing density in comparison with the conventional structure involving complex shift registers, and easily achieves a transfer frequency in excess of 100 MHz required in high-speed signal processing.

Also, a high degree of integration can be attained with a high S/N ratio, since the output impedance of the CCD register is maintained low even in an array involving several thousand photosensor cells.

What is claimed is:

1. An image sensor device comprising a linear array of photoelectric converting elements each having a semiconductive transistor with a control electrode area and having a capacitor on said control electrode area, and selector means for sequentially selecting said photoelectric converting elements, wherein the potential of the control electrode area of a thus selected photoelectric converting element is controlled through said capacitor of the selected photoelectric converting element, thereby accumulating carriers generated by photoexcitation in said control electrode area and reading a voltage generated according to the amount of said accumulation or dissipating the thus accumulated carriers; said selector means comprising:

a shift register having readout terminals provided corresponding to respective photoelectric converting elements;

first switching means, for refresh, connected to said capacitor of a corresponding photoelectric converting element and to a refresh terminal; and second switching means, for refresh, connected to said control electrode area and said capacitor of a corresponding photoelectric converting element.

* * * * *

UNITED STATES PATENT AND TRADEMARK OFFICE
CERTIFICATE OF CORRECTION

PATENT NO.  : 4,831,454
DATED       : May 16, 1989
INVENTOR(S) : NOBUYOSHI TAKANA, ET AL.         Page 1 of 4

It is certified that error appears in the above-identified patent and that said Letters Patent is hereby corrected as shown below:

COLUMN 1

Line 40, "If the" should read --if--.
    Line 50, "drawbacks" should read --the drawbacks--.

COLUMN 2

Line 26, "dementional" should read --dimensional--.
    Line 58, "a time" should read --the same time--.

COLUMN 4

Line 29, "formed is" should read --is formed--.
    Line 31, "oxide layer 8," should read
            --oxide layer 6,--.
    Line 57, "floating stat" should read --floating state--.

COLUMN 5

Line 16, "FIG. 1A" should read --FIG. 2A--.
    Line 22, "mianls Sf1-Sfn" should read
            --minals Sf1-Sfn--.
    Line 31, "abovementioned" should read
            --above-mentioned--.

COLUMN 6

Line 16, "thereform." should read --therefrom.--.
    Line 67, "embodiments" should read --embodiment--.

UNITED STATES PATENT AND TRADEMARK OFFICE
CERTIFICATE OF CORRECTION

PATENT NO. : 4,831,454

DATED : May 16, 1989

INVENTOR(S) : NOBUYOSHI TAKANA, ET AL.

Page 2 of 4

It is certified that error appears in the above-identified patent and that said Letters Patent is hereby corrected as shown below:

COLUMN 7

Line 39, "FIG. 1A." should read --FIG. 2A.--.
Line 62, "explained is" should read --is explained--.

COLUMN 8

Line 39, "output terminal 832," should read --output terminal 822,--.
Line 50, "turn of" should read --turn off--.
Line 56, "$t_{RE1}+n(tRE_2+tRE_3)$." should read --$t_{RE1}+n(t_{RE2}+t_{RE3})$.--.

COLUMN 9

Line 31, "turned" should read --turned on--.
Line 33, "turned" should read --turned on--.
Line 41, "sistors $80_1-801_n$," should read --sistors $801_1-801_n$,--.
Line 57, "shown are" should read --are shown--.
Line 64, "capacitors 904 $904_n$" should read --capacitors $904_1-904_n$--.

COLUMN 10

Line 2, "MOS transistors $901_1-009_n$" should read --MOS transistors $909_1-909_n$--.
Line 12, "MOS transistors $903_1$ $903_n$;" should read --MOS transistors $903_1-903_n$;--.
Line 46, "927" should read --926--.

UNITED STATES PATENT AND TRADEMARK OFFICE
CERTIFICATE OF CORRECTION

PATENT NO. : 4,831,454
DATED : May 16, 1989
INVENTOR(S) : NOBUYOSHI TAKANA, ET AL.

It is certified that error appears in the above-identified patent and that said Letters Patent is hereby corrected as shown below:

COLUMN 11

Line 9, "capacitor 904," should read
        --capacitor $904_1$,--.
    Line 24, "terminal $917917_i$." should read --$917_i$.--.

COLUMN 12

Line 3, "number M of row" should read
        --number m of rows--.
    Line 37, "1102;" should read --1101;--.
    Line 56, "said" should read --a--.

COLUMN 13

Line 20, "tope face" should read --top face--.

COLUMN 15

Line 14, "vase" should read --base--.
    Line 53, "FIG. 14B." should read --FIG. 14B).--.

COLUMN 16

Line 9, "a sensor" should read --a one-dimensional
        array of the above-explained photosensor--.
    Line 47, "sensor devive," should read --sensor
        device,--.

UNITED STATES PATENT AND TRADEMARK OFFICE
CERTIFICATE OF CORRECTION

PATENT NO. : 4,831,454
DATED : May 16, 1989
INVENTOR(S) : NOBUYOSHI TAKANA, ET AL.

Page 4 of 4

It is certified that error appears in the above-identified patent and that said Letters Patent is hereby corrected as shown below:

COLUMN 17

Line 34, "registor 1440." should read --register 1540.--.

COLUMN 18

Line 25, "complsed" should read --comprised--.

Signed and Sealed this

Nineteenth Day of November, 1991

Attest:

HARRY F. MANBECK, JR.

Attesting Officer     Commissioner of Patents and Trademarks